US007061027B2

(12) United States Patent
Tanaka et al.

(10) Patent No.: US 7,061,027 B2
(45) Date of Patent: Jun. 13, 2006

(54) SEMICONDUCTOR DEVICE WITH HETEROJUNCTION

(75) Inventors: Hideaki Tanaka, Yokosuka (JP); Masakatsu Hoshi, Yokohama (JP); Tetsuya Hayashi, Yokosuka (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/068,803

(22) Filed: Mar. 2, 2005

(65) Prior Publication Data

US 2005/0199873 A1 Sep. 15, 2005

(30) Foreign Application Priority Data

Mar. 9, 2004 (JP) ............ P 2004-065474

(51) Int. Cl.
*H01L 31/072* (2006.01)
(52) U.S. Cl. .......... 257/192; 257/77; 438/270; 438/285
(58) Field of Classification Search ........ 257/12, 257/77, 192; 438/270, 285
See application file for complete search history.

(56) References Cited

U.S. PATENT DOCUMENTS

2004/0079989 A1* 4/2004 Kaneko et al. ............ 257/328
2004/0217358 A1* 11/2004 Kaneko ..................... 257/77
2005/0133794 A1* 6/2005 Hayashi et al. ............ 257/77

FOREIGN PATENT DOCUMENTS

JP 2003-218398 7/2003

* cited by examiner

*Primary Examiner*—Trung Dang
(74) *Attorney, Agent, or Firm*—McDermott Will & Emery LLP

(57) ABSTRACT

An aspect of the present invention provides a semiconductor device that includes a semiconductor base made of a first semiconductor material of a first conductivity type, a hetero-semiconductor region forming a heterojunction with the semiconductor base and made of a second semiconductor material having a different band gap from the first semiconductor material, a first gate electrode arranged in the vicinity of the heterojunction, a first gate insulating film configured to insulate the first gate electrode from the semiconductor base, a source electrode formed in contact with the hetero-semiconductor region, a drain electrode formed in contact with the semiconductor base, and an electric field extending region partly facing the first gate electrode, the first gate insulating film and hetero-semiconductor region interposed between the electric field extending region and the first gate electrode, the electric field extending region extending a built-in electric field into the hetero-semiconductor region.

18 Claims, 7 Drawing Sheets

SEMICONDUCTOR DEVICE WITH HETEROJUNCTION

BACKGROUND OF THE INVENTION

The present invention relates to a semiconductor device, and particularly, to a semiconductor device having a heterojunction.

Silicon carbide has one digit larger dielectric breakdown strength than silicon and is processible by thermal oxidization like silicon. Due to this, silicon carbide is drawing attention as a next generation semiconductor material. In particular, silicon carbide is expected for application to power conversion devices. Recently those devices made of silicon carbide are high-withstand-voltage, low-loss power transistors. To reduce a loss from a power transistor, the ON-resistance of the power transistor must be lowered.

As an example of an ON-resistance reduced power transistor, Japanese Laid-Open Patent Publication No. 2003-218398 discloses a field-effect transistor. The disclosed field-effect transistor includes a hetero-semiconductor region and a silicon carbide epitaxial layer that form a heterojunction. The disclosure changes the barrier height of the heterojunction according to an electric field from a gate electrode, to realize a switching operation. This disclosure involves no channel region that is present in, for example, a MOS-type electric-field transistor, and therefore, causes no channel-region voltage drop. With this, the disclosure can reduce ON-resistance. When a high voltage is applied between a source electrode and a drain electrode, an accumulation layer formed on the hetero-semiconductor region side of a heterojunction interface terminates an electric field, so that substantially no electric field reaches the hetero-semiconductor region. As a result, the hetero-semiconductor region causes no breakdown, and a high withstand voltage is secured between the source electrode and the drain electrode.

SUMMARY OF THE INVENTION

The field-effect transistor of the disclosure mentioned above, however, has a trade-off problem that lowering the barrier height of the heterojunction to improve transistor driving force results in increasing a leakage current from the heterojunction interface when applying a high voltage between the source electrode and the drain electrode. Namely, the related art has a difficulty in simultaneously realizing a high withstand voltage and a low ON-resistance through the optimization of the barrier height of a heterojunction. In view of the problem, the present invention is to provide a semiconductor device capable of achieving a low ON-resistance, small leakage current, and high withstand voltage.

An aspect of the present invention provides a semiconductor device that includes a semiconductor base made of a first semiconductor material of a first conductivity type, a hetero-semiconductor region forming a heterojunction with the semiconductor base and made of a second semiconductor material having a different band gap from the first semiconductor material, a first gate electrode arranged in the vicinity of the heterojunction, a first gate insulating film configured to insulate the first gate electrode from the semiconductor base, a source electrode formed in contact with the hetero-semiconductor region, a drain electrode formed in contact with the semiconductor base, and an electric field extending region partly facing the first gate electrode, the first gate insulating film and hetero-semiconductor region interposed between the electric field extending region and the first gate electrode, the electric field extending region extending a built-in electric field into the hetero-semiconductor region.

Another aspect of the present invention provides a semiconductor device that includes a semiconductor base made of a first semiconductor material having a first conductivity type, a hetero-semiconductor region forming a heterojunction with the semiconductor base and made of a second semiconductor material having a different band gap from the first semiconductor material, a trench formed through the hetero-semiconductor region in a depth direction to reach the semiconductor base, a first gate insulating film and a first gate electrode formed in the trench, a source electrode formed in contact with the hetero-semiconductor region, a drain electrode formed in contact with the semiconductor base, and an electric field extending region at least partly facing the first gate electrode with the hetero-semiconductor region and first gate insulating film being interposed between the electric field extending region and the first gate electrode, the electric field extending region extending, a built-in electric field into the hetero-semiconductor region.

DETAILED DESCRIPTION OF EMBODIMENTS

Various embodiments of the present invention will be described with reference to the accompanying drawings. It is to be noted that same or similar reference numerals are applied to the same or similar parts and elements throughout the drawings, and the description of the same or similar parts and elements will be omitted or simplified.

First Embodiment

Figure 1:
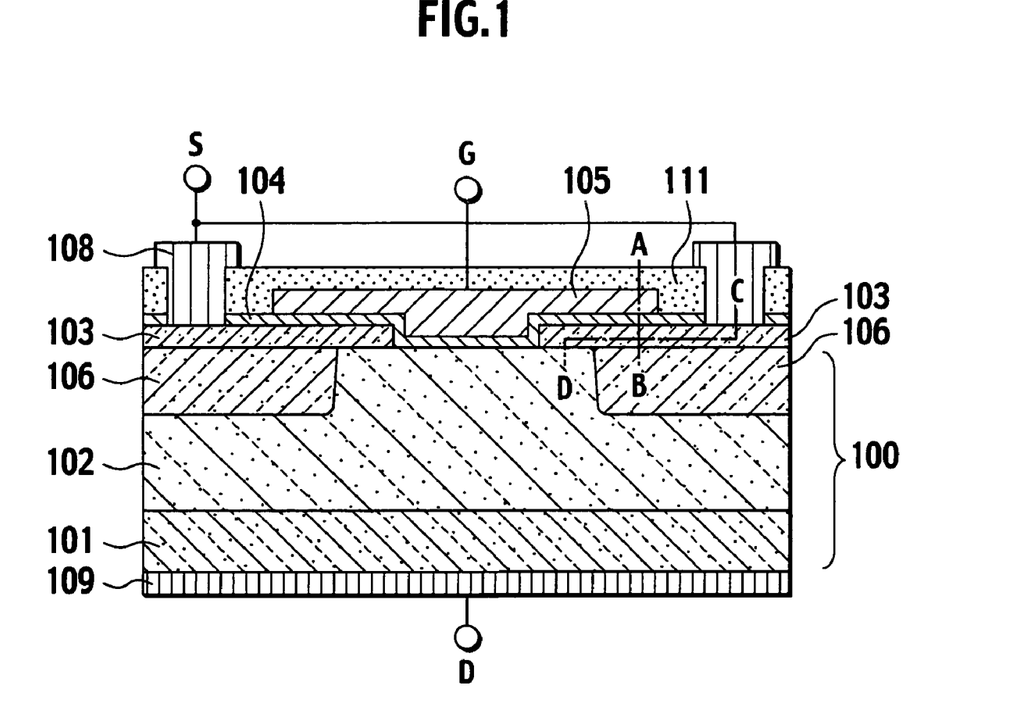
FIG. 1 is a sectional view showing a semiconductor device according to a first embodiment of the present invention.

FIG. 1 is a sectional view showing a semiconductor device according to a first embodiment of the present invention. The semiconductor device has an n-type silicon carbide substrate 101 and an n-type silicon carbide epitaxial layer 102 whose impurity concentration is lower than that of the substrate 101. The substrate 101 and epitaxial layer 102 form a silicon carbide semiconductor base 100 made of n-type silicon carbide. Here, silicon carbide serves as a first semiconductor material and n-type serves as a first conductivity type. The semiconductor base 100 forms a heterojunction with a hetero-semiconductor region 103 made of n-type polycrystalline silicon. Here, polycrystalline silicon serves as a second semiconductor material and has a band gap different from that of silicon carbide. A first gate electrode 105 is formed on a first gate insulating film 104 in the vicinity of the heterojunction formed between the epitaxial layer 102 and the hetero-semiconductor region 103. A p-type (second conductivity type) silicon carbide region 106 is in contact with the hetero-semiconductor region 103 and has a part that faces the first gate electrode 105 with the first gate insulating film 104 and hetero-semiconductor region 103 being interposed between the first gate electrode 105 and the silicon carbide region 106. A source electrode 108 is in contact with the hetero-semiconductor region 103, and a drain electrode 109 is in contact with the semiconductor base 100.

The part of the p-type silicon carbide region 106 facing the first gate electrode 105 extends a built-in electric field into the hetero-semiconductor region 103. This part of the region 106 is in contact with the hetero-semiconductor region 103. This part that extends a built-in electric field into the hetero-semiconductor region 103 is made of silicon carbide (first semiconductor material) of p-type and is in contact with the hetero-semiconductor region 103.

The source electrode 108 and first gate electrode 105 are electrically insulated from each other with an interlayer insulating film 111. Although not shown in FIG. 1, the part of the p-type silicon carbide region 106 that extends a built-in electric field into the hetero-semiconductor region 103 is in contact with the source electrode 108 at a location behind of the sectional view in FIG. 1.

Figure 2:
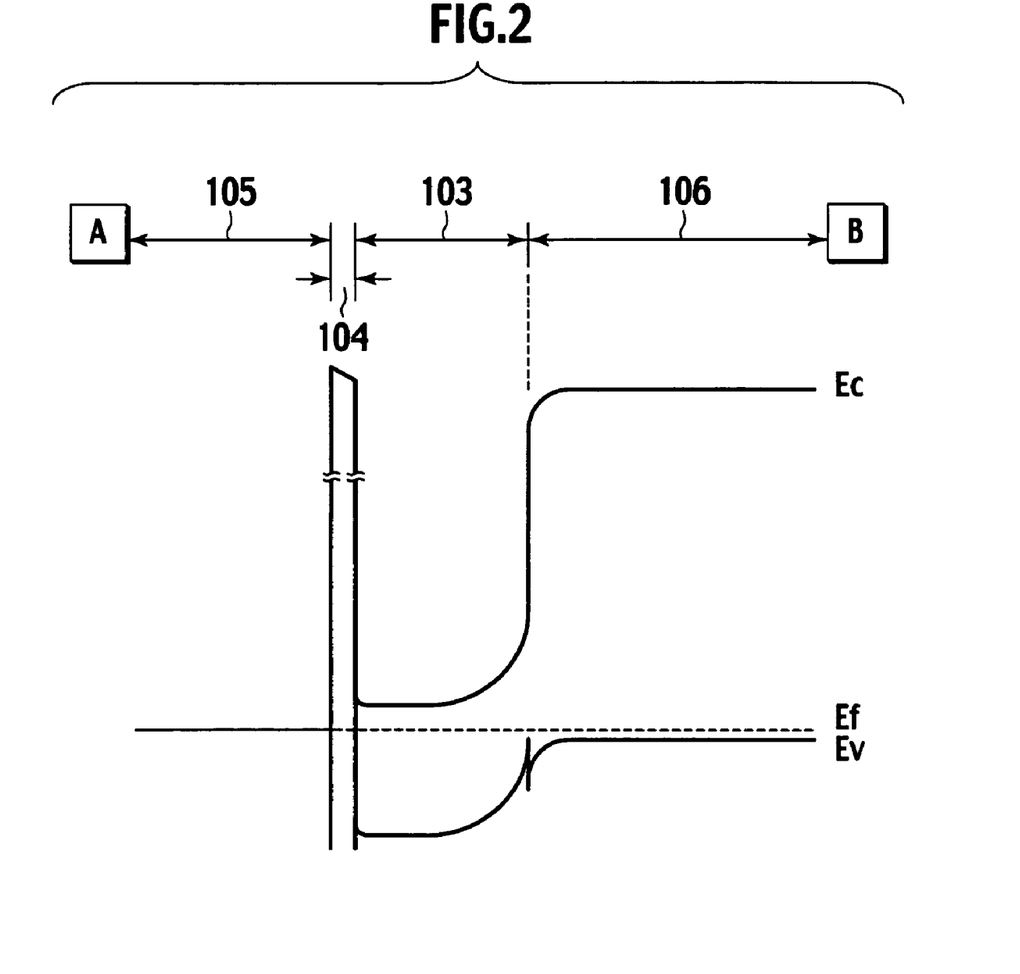
FIG. 2 shows a band structure between locations A and B shown in FIG. 1 when the source electrode 108, drain electrode 109, and first gate electrode 105 are grounded.

FIG. 2 shows a band structure between locations A and B shown in FIG. 1 when the source electrode 108, drain electrode 109, and first gate electrode 105 are grounded. With reference to FIG. 2, operation of the semiconductor device according to the first embodiment will be explained. For the sake of simplicity, a band structure of polycrystalline silicon is represented with a band structure of monocrystalline silicon.

A part of the hetero-semiconductor region 103 that is between the first gate electrode 105 and the part of the silicon carbide region 106 that extends a built-in electric field into the hetero-semiconductor region 103 is depleted as shown in FIG. 2 due to the built-in electric field from the part of the region 106 and a built-in electric field extended from the first gate electrode 105 through the first gate insulating film 104. The depletion of the hetero-semiconductor region 103 due to the built-in electric field extended from the part of the silicon carbide region 106 narrows a carrier passage and increases resistance between the source electrode 108 and the heterojunction compared with one having no silicon carbide region 106.

Figure 3:
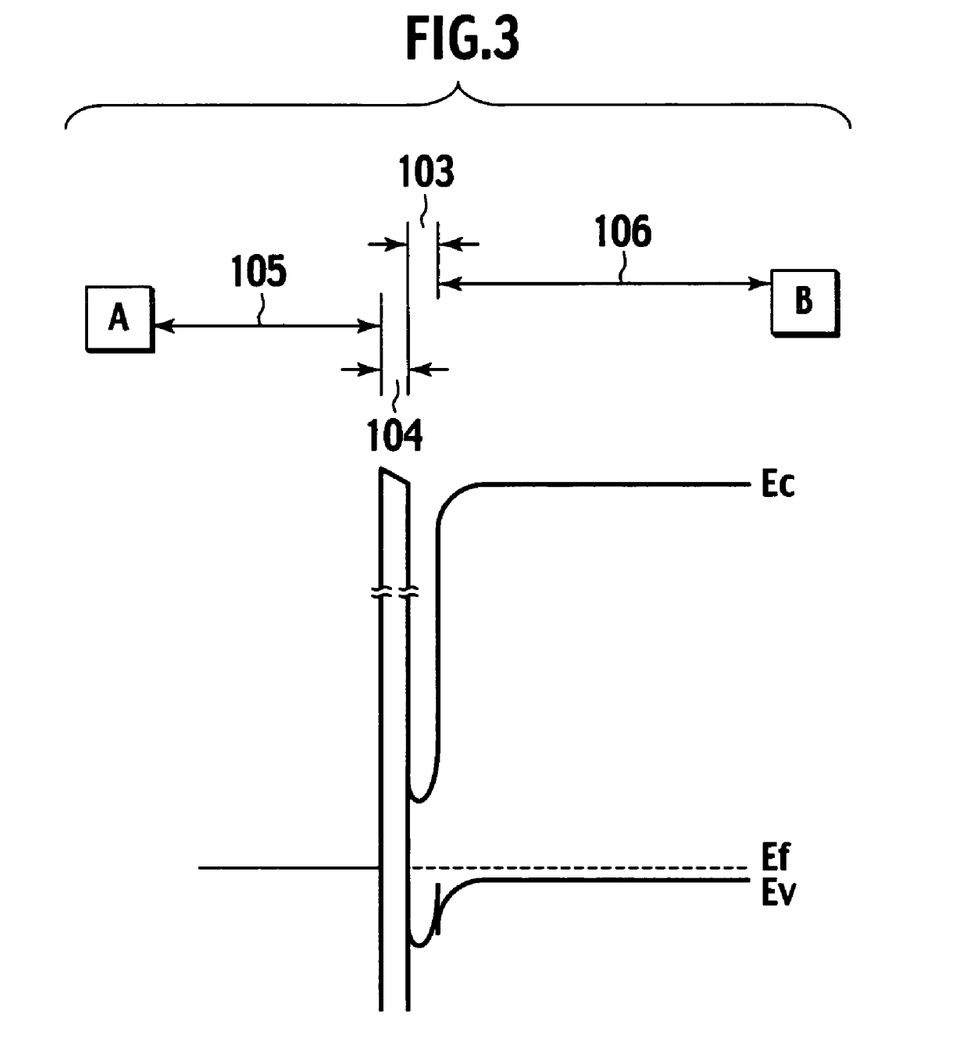
FIG. 3 shows a band structure between the locations A and B shown in FIG. 1.

FIG. 3 shows a band structure between locations A and B shown in FIG. 1. The thickness of the hetero-semiconductor region 103 between the first gate electrode 105 and the part of the p-type silicon carbide region 106 that extends a built-in electric field into the hetero-semiconductor region 103 is adjusted to be smaller than the sum of a distance for which the built-in electric field of the first gate electrode 105 extends from a junction interface between the first gate insulating film 104 and the hetero-semiconductor region 103 and a distance for which the built-in electric field of the part of the region 106 extends from a junction interface between the part of the region 106 and the hetero-semiconductor region 103 into the hetero-semiconductor region 103. When this condition is met, the band structure of FIG. 3 is established. Namely, the hetero-semiconductor region 103 between the first gate electrode 105 and the part of the silicon carbide region 106 that extends a built-in electric field into the hetero-semiconductor region 103 is completely depleted.

Figure 4A:
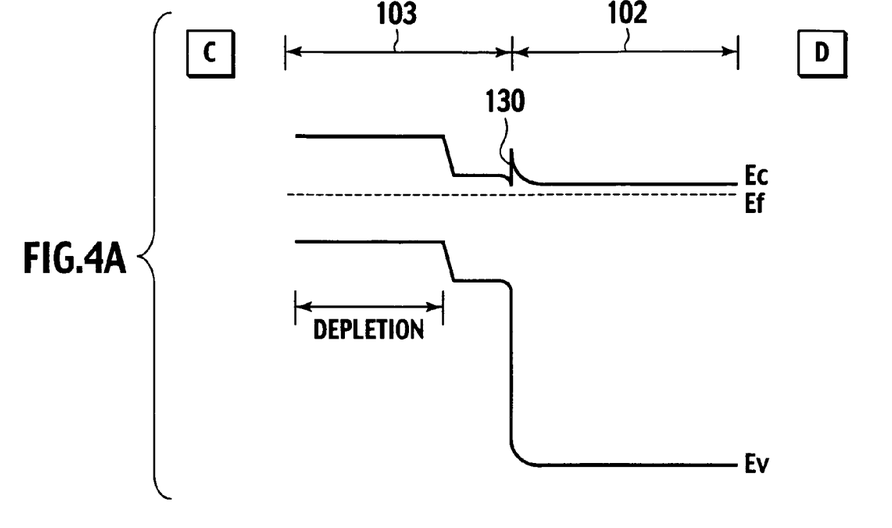
FIG. 4A shows a band structure between locations C and D shown in FIG. 1.

FIG. 4A shows a band structure between locations C and D shown in FIG. 1. The source electrode 108 and the heterojunction are electrically disconnected from each other. The source electrode 108 and first gate electrode 105 are grounded and a predetermined voltage is applied to the drain electrode 109. At this time, the source electrode 108 and drain electrode 109 are electrically disconnected from each other by a barrier 130 of the heterojunction, and therefore, no current passes between the source electrode 108 and the drain electrode 109. This is an OFF state of the semiconductor device. The hetero-semiconductor region 103 between the first gate electrode 105 and the part of the silicon carbide region 106 that extends a built-in electric field into the hetero-semiconductor region 103 is completely depleted and is in a pinch-off state. As a result, the source electrode 108 and heterojunction are electrically disconnected from each other. This reduces a leakage current from the heterojunction when a high voltage is applied between the source electrode 108 and the drain electrode 109.

Figure 4B:
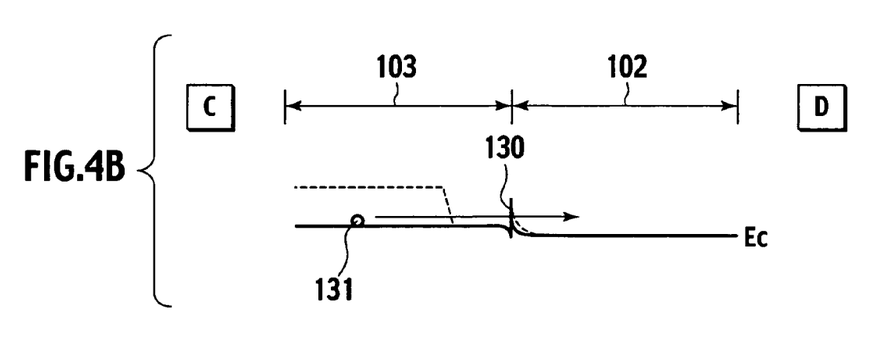
FIG. 4B shows a band structure between the locations C and D shown in FIG. 1.

FIG. 4B shows a band structure between the locations C and D shown in FIG. 1. The source electrode 108 is grounded, a given voltage is applied to the drain electrode 109, and a given voltage is applied to the first gate electrode 105. Then, a gate electric field is applied to the hetero-semiconductor region 103 through the first gate insulating film 104, to change the height of the barrier 130 of the heterojunction. At this time, a depleted area formed inside the hetero-semiconductor region 103 accumulates electrons 131 to form an accumulation layer. An electric field from the drain electrode 109 causes electrons 131 to flow from the source electrode 108 to the drain electrode 109. This forms an ON state of the semiconductor device. In the ON state, an electric field from the insulated first gate electrode 105 forms an accumulation layer in the depleted hetero-semiconductor region 103, to drop resistance. This leads to reduce a leakage current during an OFF state without increasing ON-resistance.

Thereafter, the source electrode 108 is grounded, a given voltage is applied to the drain electrode 109, the first gate electrode 105 is grounded, and the gate voltage applied to the first gate electrode 105 is removed. Then, the band structure between the locations C and D shown in FIG. 1 restores the OFF state shown in FIG. 4A. In this way, the semiconductor device according to the first embodiment realizes a switching operation.

Figure 4C:
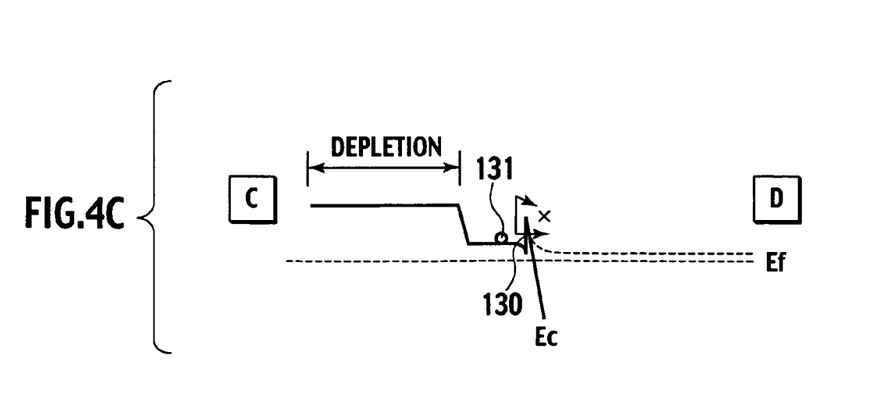
FIG. 4C shows a band structure between the locations C and D shown in FIG. 1.

FIG. 4C shows a band structure between the locations C and D shown in FIG. 1. The source electrode 108 and first gate electrode 105 are grounded and a high voltage is applied to the drain electrode 109. In this case, electrons 131 accumulated on the hetero-semiconductor region 103 side of the heterojunction interface terminate an electric field so that substantially no electric field reaches the hetero-semiconductor region 103. This means that the hetero-semiconductor region 103 will never break down at first Depending on the height of the barrier 130 of the heterojunction, the electrons 131 accumulated on the hetero-semiconductor region 103 side of the heterojunction interface may pass over or tunnel through the barrier 130 of the heterojunction, toward the silicon carbide epitaxial layer 102. The depleted area formed inside the hetero-semiconductor region 103, however, electrically disconnects the source electrode 108 and heterojunction from each other. Accordingly, the electrons 131 will not flow toward the epitaxial layer 102. In this way, even if a high voltage is applied between the source electrode 108 and the drain electrode 109, the semiconductor device of the first embodiment realizes high disconnection ability.

When a high voltage is applied between the source electrode 108 and the drain electrode 109, the inside of the p-type silicon carbide region 106 that extends a built-in electric field into the hetero-semiconductor region 103 acts as an electric field relaxing layer, to relax a drain electric field around the heterojunction interface.

During an OFF state of the semiconductor device according to the first embodiment, a high resistance layer is interposed between the source electrode 108 and the heterojunction, or the source electrode 108 and heterojunction are electrically disconnected from each other. In an ON state, a gate electric field is applied from the first gate electrode 105 through the first gate insulating film 104 to the hetero-semiconductor region 103, to form an accumulation layer in the depleted area. Namely, during the ON state, there is substantially no built-in electric field acting on the hetero-semiconductor region 103. Namely, the semiconductor device of the first embodiment simultaneously realizes low ON-resistance and high withstand voltage.

In this way, the first embodiment employs the first semiconductor material (silicon carbide in this embodiment) having the second conductivity type (p-type in this embodiment) for the part that extends an electric field to the hetero-semiconductor region 103, so that the electric field may effectively extend into the hetero-semiconductor region 103. This results in readily depleting the hetero-semiconductor region 103 and surely disconnecting the source electrode 108 and heterojunction from each other. In addition, a depletion layer efficiently spreads from the first semiconductor material of the second conductivity type to the semiconductor base of the first conductivity type, to effectively relax an electric field applied to the heterojunction.

Second Embodiment

In the first embodiment, the part that extends a built-in electric field into the hetero-semiconductor region 103 is a part of the p-type silicon carbide region 106. Instead of the p-type silicon carbide region 106, the second embodiment employs metal whose work function is greater than that of the first semiconductor material (silicon carbide) having the first conductivity type (n-type) and that of the second semiconductor material (polycrystalline silicon).

Figure 5:
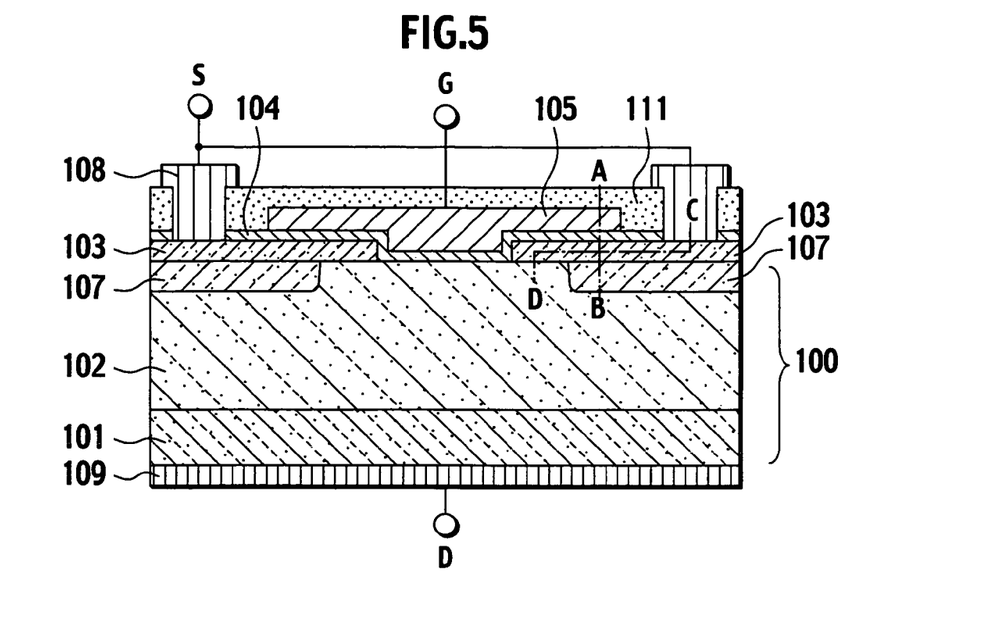
FIG. 5 is a sectional view showing a semiconductor device according to the second embodiment

FIG. 5 is a sectional view showing a semiconductor device according to the second embodiment. The semiconductor device includes an n-type silicon carbide substrate 101 and an n-type silicon carbide epitaxial layer 102 whose impurity concentration is lower than that of the substrate 101. The substrate 101 and epitaxial layer 102 form a silicon carbide semiconductor base 100 made of n-type silicon carbide. Here, silicon carbide is a first semiconductor material and n-type is a first conductivity type. The semiconductor base 100 forms a heterojunction with a hetero-semiconductor region 103 made of polycrystalline silicon which serves as a second semiconductor material and whose band gap differs from that of silicon carbide. Adjacent to the heterojunction formed by the epitaxial layer 102 and hetero-semiconductor region 103, there is a first gate insulating film 104 on which a first gate electrode 105 is formed. The first gate electrode 105 faces a metal region 107 with the first gate insulating film 104 and hetero-semiconductor region 103 being interposed between the first gate electrode 105 and the metal region 107. The metal region 107 is in contact with the hetero-semiconductor region 103 and is made of metal whose work function is greater than that of n-type silicon carbide and that of polycrystalline silicon. A source electrode 108 is in contact with the hetero-semiconductor region 103, and a drain electrode 109 is in contact with the semiconductor base 100. The work function of a semiconductor material is the sum of an electron affinity "χ" and an energy difference "Ec–Ef" between a conduction band and a Fermi level.

A part of the metal region 107 opposes the first gate electrode 105, extends a built-in electric field into the hetero-semiconductor region 103, and is in contact with the hetero-semiconductor region 103. Namely, the part of the metal region 107 that extends a built-in electric field into the hetero-semiconductor region 103 is in contact with the hetero-semiconductor region 103 and opposes to the first gate electrode 105. The work function of the metal region 107 is greater than that of n-type silicon carbide and that of polycrystalline silicon.

The source electrode 108 and first gate electrode 105 are electrically insulated from each other by an interlayer insulating film 111. Although not shown in FIG. 5, the part of the metal region 107 that extends a built-in electric field into the hetero-semiconductor region 103 is in contact with the source electrode 108 at a location behind of the sectional view in FIG. 5.

Figure 6:
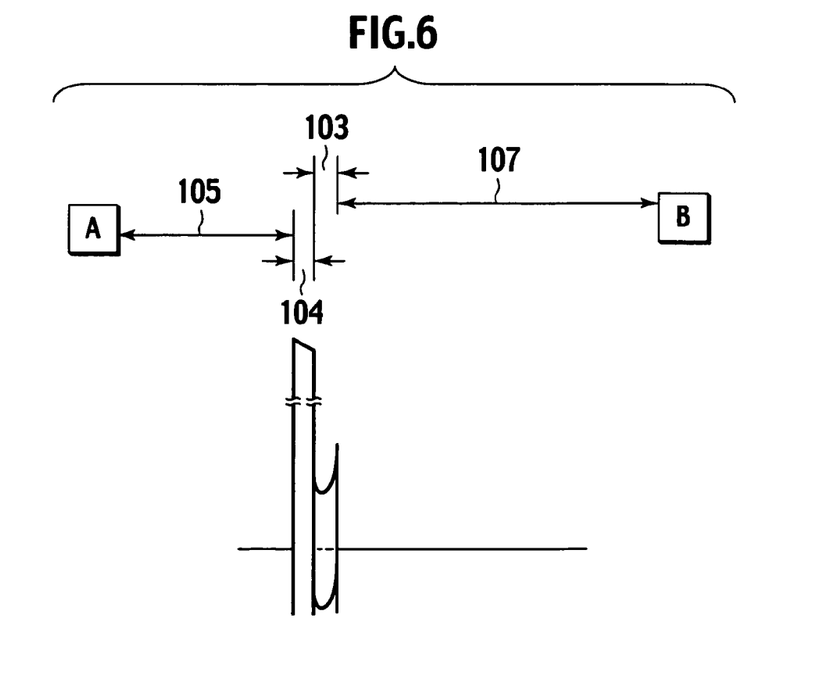
FIG. 6 shows a band structure between locations A and B shown in FIG. 5.

FIG. 6 shows a band structure between locations A and B shown in FIG. 5. Like the first embodiment of FIG. 3 that employs p-type silicon carbide, the second embodiment can completely deplete the hetero-semiconductor region 103. As a result, a band structure between locations C and D (FIG. 5) becomes similar to that of FIG. 4A. Namely, the semiconductor device according to the second embodiment provides device characteristics similar to those of the first embodiment.

The metal region 107 whose work function is greater than that of n-type silicon carbide and that of polycrystalline silicon is made of, for example, nickel (Ni) and platinum (Pt). In this case, the height of a Schottky barrier formed at a junction interface between polycrystalline silicon and the metal becomes higher to effectively extend a built-in electric field into the hetero-semiconductor region 103.

Third Embodiment

Figure 7:
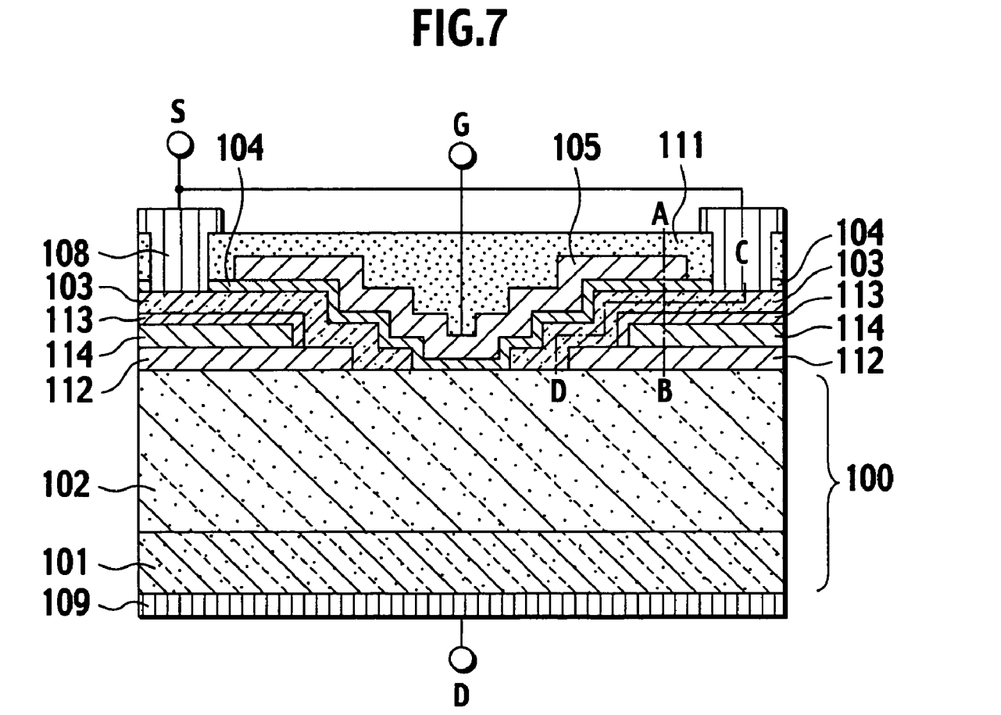
FIG. 7 is a sectional view showing a semiconductor device according to a third embodiment of the present invention.

FIG. 7 is a sectional view showing a semiconductor device according to a third embodiment of the present invention. In FIG. 7, a silicon carbide semiconductor base 100 includes an n-type silicon carbide substrate 101 and an n-type silicon carbide epitaxial layer 102 whose impurity concentration is lower than that of the substrate 101. The semiconductor base 100 forms a heterojunction with a hetero-semiconductor region 103 made of polycrystalline silicon serving as a second semiconductor material whose band gap is different from that of silicon carbide. Adjacent to the heterojunction formed by the epitaxial layer 102 and hetero-semiconductor region 103, there is a first gate insulating film 104 on which a first gate electrode 105 is formed. Facing the first gate electrode 105 through the hetero-semiconductor region 103 and first gate insulating film 104, there is an insulated gate region consisting of a second gate insulating film 113 and a second gate electrode 114. A source electrode 108 is in contact with the hetero-semiconductor region 103, and a drain electrode 109 is in contact with the semiconductor base 100.

The second gate insulating film 113 is formed above a field oxide film 112. The source electrode 108 and first gate electrode 105 are electrically insulated from each other by an interlayer insulating film 111. Although not shown in FIG. 7, the second gate electrode 114 of the insulated gate region is in contact with the gate electrode 105 at a location behind of the section view in FIG. 7. A part of the insulated gate region consisting of the second gate insulating film 113 and second gate electrode 114 opposes to the first gate electrode 105 and extends a built-in electric field into the hetero-semiconductor region 103. The field oxide film 112 is thicker than a standard oxide film.

Figure 8:
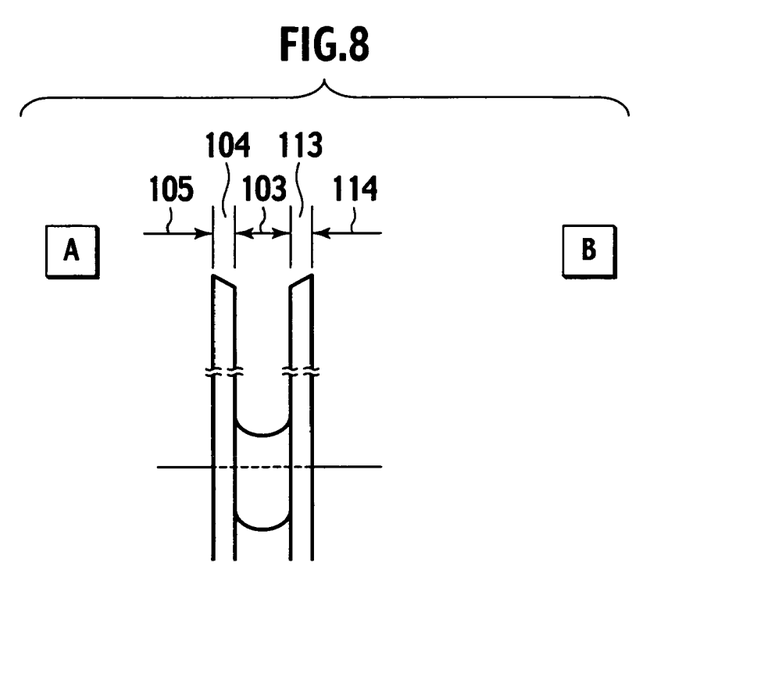
FIG. 8 shows a band structure between locations A and B shown in FIG. 7.

FIG. 8 shows a band structure between locations A and B shown in FIG. 7. Like the first embodiment of FIG. 3 employing p-type silicon carbide, the hetero-semiconductor region 103 of the third embodiment is completely depleted As a result, a band structure between locations C and D shown in FIG. 7 becomes similar to that of FIG. 4A Namely, the semiconductor device according to the third embodiment provides device characteristics similar to those of the first and second embodiments.

As explained above, the third embodiment sandwiches the hetero-semiconductor region 103 between the first gate region consisting of the first gate insulating film 104 and first gate electrode 105 and the second gate region consisting of the second gate insulating film 113 and second gate electrode 114, to efficiently deplete the hetero-semiconductor region 103. Since the second gate electrode 114 is an insulated gate electrode, the semiconductor device of the third embodiment can realize improved disconnection ability by applying a negative voltage to the second gate electrode 114 in an OFF state.

The semiconductor device according to any one of the first to third embodiments has a planar structure having the hetero-semiconductor region 103 made of polycrystalline silicon. According to the embodiments, the thickness of the hetero-semiconductor region 103 held between the gate electrode 105 and the part that extends a built-in electric field into the hetero-semiconductor region 103 is set to be smaller than the sum of a distance for which a built-in electric field of the first gate electrode 105 extends from a junction interface between the gate insulating film 104 and the hetero-semiconductor region 103 into the hetero-semiconductor region 103 and a distance for which the built-in electric field of the part extends from a junction interface between the part and the hetero-semiconductor region 103 into the hetero-semiconductor region 103. Since thinning a polycrystalline silicon layer (the hetero semiconductor region 103) is easy, the semiconductor devices of the embodiments are advantageous in manufacturing. The semiconductor device according to any one of the first to third embodiments has a planar structure having the hetero-semiconductor region 103 made of polycrystalline silicon. According to the embodiments, it is relatively easy to control the thickness of the hetero-semiconductor region 103 held between the gate electrode 105 and the part that extends a built-in electric field into the hetero-semiconductor region 103 to control the thickness of polycrystalline silicon layer since the hetero-semiconductor region 103 is made of polycrystalline silicon. That is to say, it is easy to be set the hetero-semiconductor region 103 to be smaller than the sum of a distance for which an electric field of the first gate electrode 105 extends from a junction interface between the gate insulating film 104 and the hetero-semiconductor region 103 into the hetero-semiconductor region 103, and a distance for which an electric field of the part extends from a junction interface between the part and the hetero-semiconductor region 103 into the hetero-semiconductor region 103. Since thinning the hetero-semiconductor region 103 is easy, the semiconductor devices of the embodiments are advantageous in manufacturing.

Fourth Embodiment

Figure 9:
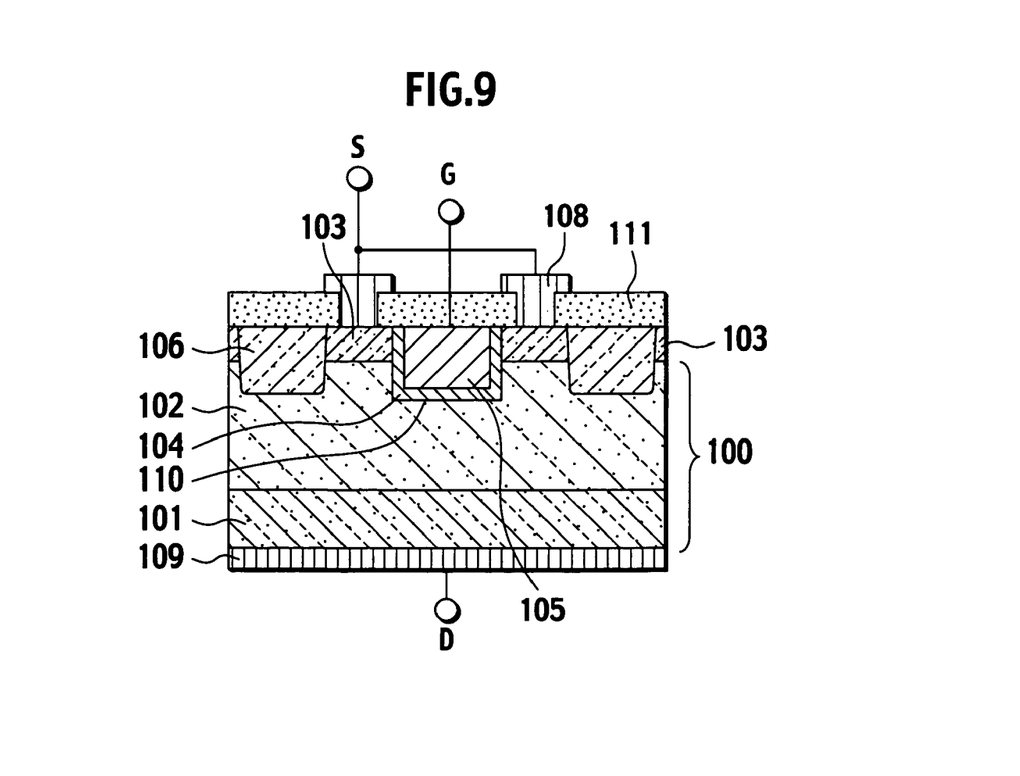
FIG. 9 is a sectional view showing a semiconductor device according to a fourth embodiment of the present invention.

FIG. 9 is a sectional view showing a semiconductor device according to a fourth embodiment of the present invention. In the semiconductor device of the fourth embodiment, a silicon carbide semiconductor base 100 includes an n-type silicon carbide substrate 101 and an n-type silicon carbide epitaxial layer 102 whose impurity concentration is lower than that of the substrate 101. The semiconductor base 100 forms a heterojunction with a hetero-semiconductor region 103 made of polycrystalline silicon serving as a second semiconductor material whose band gap is different from that of silicon carbide. A trench 110 is formed through the hetero-semiconductor region 103 in a depth direction, to reach the semiconductor base 100. In the trench 110, there are formed a gate insulating film 104 and a gate electrode 105. The gate electrode 105 is, through the gate insulating film 104, adjacent to the heterojunction formed by the epitaxial layer 102 and hetero-semiconductor region 103. A part of a p-type silicon carbide region 106 is in contact with the hetero-semiconductor region 103, faces, through the hetero-semiconductor region 103 and gate insulating film 104, the gate electrode 105, and extends a built-in electric field into the hetero-semiconductor region 103. A source electrode 108 is in contact with the hetero-semiconductor region 103, and a drain electrode 109 is in contact with the semiconductor body 100.

The source electrode 108 and first gate electrode 105 are electrically insulated from each other by an interlayer insulating film 111. Although not shown in FIG. 9, the part of the p-type silicon carbide region 106 that extends a built-in electric field into the hetero-semiconductor region 103 is in contact with the source electrode 108 at a location behind FIG. 9.

The semiconductor device of FIG. 9 has a trench gate structure with the gate insulating film 104 and gate electrode 105 formed in the trench 110, to reduce an element area per cell. This structure is advantageous in increasing integration and reducing ON-resistance.

According to the fourth embodiment, the part that extends a built-in electric field into the hetero-semiconductor region 103 is of the p-type silicon carbide region 106. Instead of the p-type silicon carbide region 106, the metal region 107 of the second embodiment whose work function is greater than that of n-type silicon carbide and that of polycrystalline silicon, or the insulated gate region of the third embodiment consisting of the second gate insulating film 113 and second gate electrode 114 may be employed to provide the same effect.

The above-mentioned embodiments employ silicon carbide as a first semiconductor material to provide a semiconductor device having a high withstand voltage. The above-mentioned embodiments employ polycrystalline silicon as a second semiconductor material to form a proper heterojunction in the semiconductor device to provide the effect of the present invention. Instead of the polycrystalline silicon, monocrystalline silicon or amorphous silicon is employable to provide the effect of the present invention. Namely, the second semiconductor material may be at least one selected from the group consisting of polycrystalline silicon, monocrystalline silicon, and amorphous silicon, to provide the effect of the present invention. Any one of the polycrystalline silicon, monocrystalline silicon, and amorphous silicon is appropriate for semiconductor processes such as deposition, oxidization, patterning, selective etching, and selective conductivity control.

The above-mentioned embodiments employ silicon carbide as a first semiconductor material and polycrystalline silicon as a second semiconductor material when manufacturing a semiconductor device. Materials to form the semiconductor base and hetero-semiconductor region of a semiconductor device according to the present invention are not limited to them. For example, the first semiconductor material may be gallium nitride and the second semiconductor material may be silicon germanium. Silicon carbide (SiC) used for the present invention may have a crystalline system of, for example, 4H, 6H, 3C, or any other.

A semiconductor device according to any one of the above-mentioned embodiments is of an accumulation type with a hetero-semiconductor region made of polycrystalline silicon (second semiconductor material) of n-type (first conductivity type). The present invention is also applicable to an inversion-type semiconductor device employing polycrystalline silicon of p-type (second conductivity type). Although the above-mentioned embodiments define n-type as a first conductivity type and p-type as a second conductivity type, the effect of the present invention is obtainable by defining p-type as a first conductivity type and n-type as a second conductivity type.

The entire contents of Japanese patent application P2004-065474 filed Mar. 9$^{th}$, 2004 are hereby incorporated by reference.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A semiconductor device comprising:
    a semiconductor base made of a first semiconductor material of a first conductivity type;
    a hetero-semiconductor region forming a heterojunction with the semiconductor base and made of a second semiconductor material having a different band gap from the first semiconductor material;
    a first gate electrode arranged in the vicinity of the heterojunction;
    a first gate insulating film configured to insulate the first gate electrode from the semiconductor base;
    a source electrode formed in contact with the hetero-semiconductor region;
    a drain electrode formed in contact with the semiconductor base; and
    an electric field extending region at least partly facing the first gate electrode, the first gate insulating film and hetero-semiconductor region interposed between the electric field extending region and the first gate electrode, the electric field extending region extending a built-in electric field into the hetero-semiconductor region.

2. The semiconductor device as clamed in claim 1, wherein the electric field extending region is at least partly in the semiconductor base.

3. The semiconductor device as clamed in claim 1, wherein the thickness of the hetero-semiconductor region between the first gate electrode and the electric field extending region is smaller than a sum of a distance for which an electric field of the first gate electrode extends from a junction interface between the gate insulating film and the hetero-semiconductor region into the hetero-semiconductor region, and a distance for which an electric field of the part extends from a junction interface between the part and the hetero-semiconductor region into the hetero-semiconductor region.

4. The semiconductor device as clamed in claim 1, wherein the electric field extending region comprises:
    a second gate insulating film arranged in contact with the hetero-semiconductor region; and
    a second gate electrode arranged in contact with the second gate insulating film.

5. The semiconductor device as clamed in claim 4, wherein the electric field extending region further comprises:
    a field oxide film arranged between the semiconductor base and the second gate electrode and in contact with them.

6. The semiconductor device as clamed in claim 1, wherein the electric field extending region is arranged in contact with the hetero-semiconductor region and is made of metal whose work function is greater than that of the first semiconductor material having the first conductivity type and that of the second semiconductor material.

7. The semiconductor device as clamed in claim 1, wherein the electric field extending region is made of the first semiconductor material having a second conductivity type and arranged in contact with the hetero-semiconductor region.

8. The semiconductor device as clamed in claim 7, wherein the first semiconductor material is silicon carbide.

9. The semiconductor device as clamed in claim 1, wherein the second semiconductor material is made of at least one selected from the group consisting of polycrystalline silicon, monocrystalline silicon, and amorphous silicon.

10. A semiconductor device comprising:
    a semiconductor base made of a first semiconductor material of a first conductivity type;
    a hetero-semiconductor region forming a heterojunction with the semiconductor base and made of a second semiconductor material having a different band gap from the first semiconductor material;
    a trench formed through the hetero-semiconductor region to reach the semiconductor base;
    a first gate insulating film formed in the trench
    a first gate electrode formed in the trench and insulated from the semiconductor base by the first gate insulating film;
    a source electrode formed in contact with the hetero-semiconductor region;
    a drain electrode formed in contact with the semiconductor base; and
    an electric field extending region at least partly facing the first gate electrode, the first gate insulating film and the hetero-semiconductor region interposed between the electric field extending region and the first gate electrode, the electric field extending region extending a built-in electric field into the hetero-semiconductor region.

11. The semiconductor device as clamed in claim 10, wherein the electric field extending region is at least partly in the semiconductor base.

12. The semiconductor device as clamed in claim 10, wherein the thickness of the hetero-semiconductor region between the first gate electrode and the electric field extending region is smaller than the sum of a distance for which an electric field of the first gate electrode extends from a junction interface between the gate insulating film and the hetero-semiconductor region into the hetero-semiconductor region, and a distance for which an electric field of the part extends from a junction interface between the part and the hetero-semiconductor region into the hetero-semiconductor region.

13. The semiconductor device as clamed in claim 10, wherein the electric field extending region comprises:
 a second gate insulating film arranged in contact with the hetero-semiconductor region; and
 a second gate electrode arranged in contact with the second gate insulating film.

14. The semiconductor device as clamed in claim 13, wherein the electric field extending region further comprises:
 a field oxide film arranged between the semiconductor base and the second gate electrode and in contact with them.

15. The semiconductor device as clamed in claim 10, wherein the electric field extending region is arranged in contact with the hetero-semiconductor region and is made of metal whose work function is greater than that of the first semiconductor material having the first conductivity type and that of the second semiconductor material.

16. The semiconductor device as clamed in claim 10, wherein the electric field extending region is made of the first semiconductor material having a second conductivity type and arranged in contact with the hetero-semiconductor region.

17. The semiconductor device as clamed in claim 16, wherein the first semiconductor material is silicon carbide.

18. The semiconductor device as clamed in claim 10, wherein the second semiconductor material is made of at least one selected from the group consisting of polycrystalline silicon, monocrystalline silicon, and amorphous silicon.

* * * * *